United States Patent
Farris et al.

(10) Patent No.: US 10,802,069 B2
(45) Date of Patent: Oct. 13, 2020

(54) APPLIANCES WITH PCB TRACE INTEGRITY SENSING

(71) Applicant: Haier US Appliance Solutions, Inc., Wilmington, DE (US)

(72) Inventors: Brett Alan Farris, Louisville, KY (US); Eric Theodore Hervol, Prospect, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 88 days.

(21) Appl. No.: 16/247,693

(22) Filed: Jan. 15, 2019

(65) Prior Publication Data
US 2020/0225280 A1 Jul. 16, 2020

(51) Int. Cl.
*H05K 1/03* (2006.01)
*G01R 31/28* (2006.01)
*H05K 1/02* (2006.01)
*H01H 47/00* (2006.01)

(52) U.S. Cl.
CPC ....... *G01R 31/2853* (2013.01); *H01H 47/002* (2013.01); *H05K 1/0268* (2013.01)

(58) Field of Classification Search
CPC . G01R 31/2853; H05K 1/0268; H01H 47/002
USPC .................................... 324/763.01
See application file for complete search history.

(56) References Cited

U.S. PATENT DOCUMENTS

| | | | | |
|---|---|---|---|---|
| 9,408,294 | B2 * | 8/2016 | Leone | H05K 1/0201 |
| 9,842,714 | B2 * | 12/2017 | Reder | A47L 15/0049 |
| 2004/0141263 | A1 | 7/2004 | Barger | |
| 2014/0285929 | A1 | 9/2014 | Lorenzi et al. | |
| 2018/0045793 | A1 | 2/2018 | Herics et al. | |
| 2019/0324075 | A1 * | 10/2019 | Kinsella | H01F 38/30 |

FOREIGN PATENT DOCUMENTS

KR 101264141 B1 5/2013

* cited by examiner

*Primary Examiner* — Reena Aurora
(74) *Attorney, Agent, or Firm* — Dority & Manning, P.A.

(57) ABSTRACT

An appliance with automatic sensing of printed circuit board (PCB) trace integrity and associated methods of sensing are provided. The appliance may include a controller operative to control operation of the appliance, a load in operative communication with the controller, and a PCB. The PCB may include a first trace supplying AC power to the load, a second trace supplying a return path for the AC power, a third trace supplying an alternate return path for the AC power, and current sensing circuitry. The current sensing circuitry may be configured to sense leakage current between the first trace and the third trace, with the leakage current being indicative of declining trace integrity of the PCB.

20 Claims, 6 Drawing Sheets

APPLIANCES WITH PCB TRACE INTEGRITY SENSING

FIELD OF THE INVENTION

The present subject matter relates generally to appliances, and more particularly to appliances with automatic sensing of PCB trace integrity.

BACKGROUND OF THE INVENTION

In existing appliances, one or more printed circuit boards (PCB) may be used to provide AC power and control signals to different loads of the appliance. For example, in a dishwashing appliance, PCBs may be used to supply AC power to a wash tub, heater, pumps, and other loads. Depending upon frequency of use and other scenarios, traces in the PCB may begin to breakdown. This form of breakdown, also termed arc-tracking, can be detrimental to the attached loads. For example, some arc-tracking events may provide for catastrophic failure of one or more loads or components of an appliance.

As a result, further improvements in preventing arc-tracking in appliances may be desirable. In particular, it would be advantageous to provide a PCB with automatic sensing of trace integrity to avoid failure of the traces, arc-tracking, or other scenarios.

BRIEF DESCRIPTION OF THE INVENTION

Aspects and advantages of the invention will be set forth in part in the following description, or may be obvious from the description, or may be learned through practice of the invention.

In one example aspect of the present disclosure, an appliance with automatic sensing of printed circuit board (PCB) trace integrity is provided. The appliance may include a controller operative to control operation of the appliance, a load in operative communication with the controller, and a PCB. The PCB may include a first trace supplying AC power to the load, a second trace supplying a return path for the AC power, a third trace supplying an alternate return path for the AC power, and current sensing circuitry. The current sensing circuitry may be configured to sense leakage current between the first trace and the third trace, with the leakage current being indicative of declining trace integrity of the PCB.

In another example aspect of the present disclosure, a method of sensing printed circuit board (PCB) trace integrity in an appliance is provided. The method may include providing AC power to a load of the appliance on a first trace of a PCB. The PCB may include a second trace for a first return path for the AC power, and, a third trace for providing an alternate return path for the AC power. The method may also include sensing leakage current between the first trace and the third trace, and, severing the first trace and the second trace responsive to the sensing of the leakage current.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
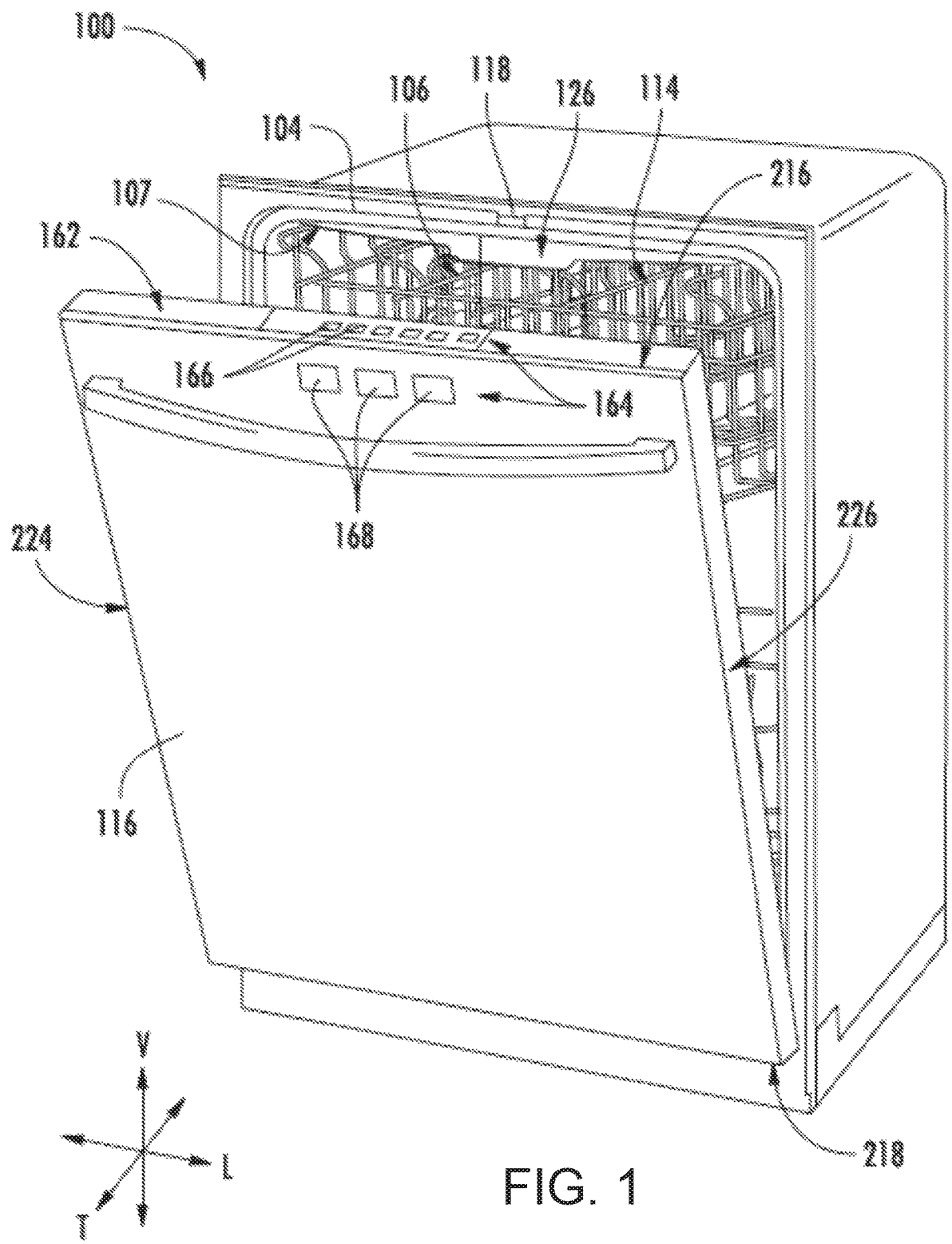
FIG. 1 provides a perspective view of a dishwasher appliance, according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the term "or" is generally intended to be inclusive (i.e., "A or B" is intended to mean "A or B or both"). Furthermore, as used herein, terms of approximation, such as "approximately" or "substantially," refer to being within a ten percent margin of error.

Figure 2:
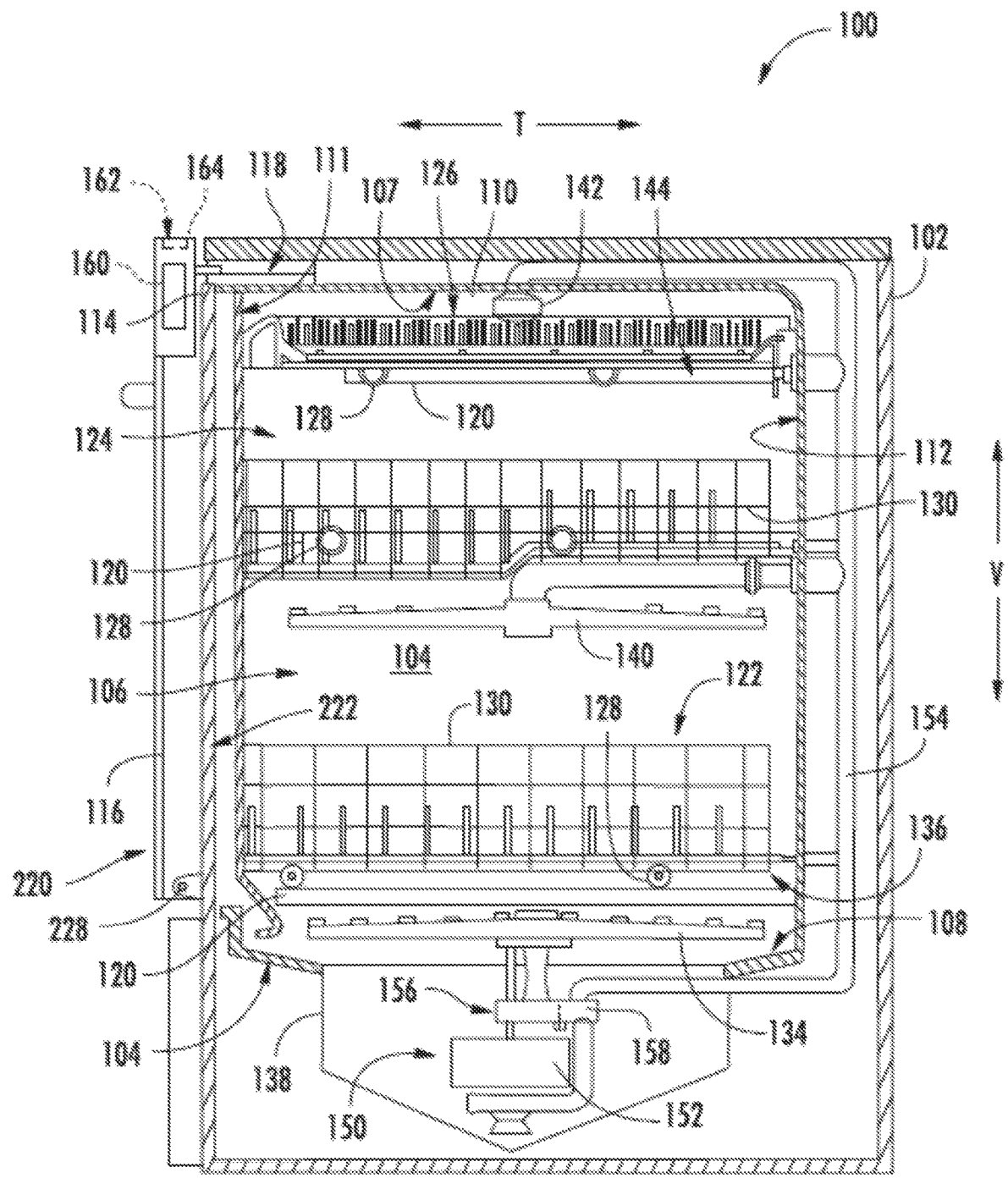
FIG. 2 provides a cross-sectional side view of the example dishwashing appliance of FIG. 1.

FIGS. 1 and 2 depict an example domestic dishwasher or dishwashing appliance 100 that may be configured in accordance with aspects of the present disclosure. For the particular embodiment of FIGS. 1 and 2, the dishwasher 100 includes a cabinet 102 having a tub 104 therein that defines a wash chamber 106. As shown, tub 104 extends between a top 107 and a bottom 108 along a vertical direction V, between a pair of side walls 110 along a lateral direction L, and between a front side 111 and a rear side 112 along a transverse direction T. Each of the vertical direction V, lateral direction L, and transverse direction T are mutually orthogonal to one another.

The tub 104 includes a front opening 114 and a door 116 hinged at its bottom for movement between a normally closed vertical position (shown in FIG. 2), wherein the wash chamber 106 is sealed shut for washing operation, and a horizontal open position for loading and unloading of articles from the dishwasher 100. In the normally closed position, door 116 extends from a top end 216 to a bottom end 218 along the vertical direction V; from a front end 220 to a rear end 222 along the transverse direction T; and between two lateral ends 224, 226 along the lateral direction L. A pivot axis 228 may be defined on the door 214 (e.g., by one or more lateral pivot hinges or pins), for example, parallel to the lateral direction L at or proximal to bottom end 218. According to example embodiments, dishwasher 100 further includes a door closure mechanism or assembly 118 that is used to lock and unlock door 116 for accessing and sealing wash chamber 106.

As illustrated in FIG. 2, tub side walls 110 may accommodate a plurality of rack assemblies. More specifically, guide rails 120 may be mounted to side walls 110 for supporting a lower rack assembly 122, a middle rack assembly 124, and an upper rack assembly 126. As illustrated, upper rack assembly 126 is positioned at a top portion of wash chamber 106 above middle rack assembly 124, which is positioned above lower rack assembly 122 along the vertical direction V. Each rack assembly 122, 124, 126 is adapted for movement between an extended loading position (not shown) in which the rack is substantially positioned outside the wash chamber 106, and a retracted position (shown in FIGS. 1 and 2) in which the rack is located inside the wash chamber 106. This is facilitated, for example, by rollers 128 mounted onto rack assemblies 122, 124, 126, respectively. Although a guide rails 120 and rollers 128 are illustrated herein as facilitating movement of the respective rack assemblies 122, 124, 126, it should be appreciated that any suitable sliding mechanism or member may be used according to alternative embodiments.

Some or all of the rack assemblies 122, 124, 126 are fabricated into lattice structures including a plurality of wires or elongated members 130 (for clarity of illustration, not all elongated members making up rack assemblies 122, 124, 126 are shown in FIG. 2). In this regard, rack assemblies 122, 124, 126 are generally configured for supporting articles within wash chamber 106 while allowing a flow of wash fluid to reach and impinge on those articles (e.g., during a cleaning or rinsing cycle). According to another example embodiment, a silverware basket (not shown) may be removably attached to a rack assembly (e.g., lower rack assembly 122) for placement of silverware, utensils, and the like, that are otherwise too small to be accommodated by rack 122.

Dishwasher 100 further includes a plurality of spray assemblies for urging a flow of water or wash fluid onto the articles placed within wash chamber 106. More specifically, as illustrated in FIG. 2, dishwasher 100 includes a lower spray arm assembly 134 disposed in a lower region 136 of wash chamber 106 and above a sump 138 so as to rotate in relatively close proximity to lower rack assembly 122. Similarly, a mid-level spray arm assembly 140 is located in an upper region of wash chamber 106 and may be located below and in close proximity to middle rack assembly 124. In this regard, mid-level spray arm assembly 140 may generally be configured for urging a flow of wash fluid up through middle rack assembly 124 and upper rack assembly 126. Additionally, an upper spray assembly 142 may be located above upper rack assembly 126 along the vertical direction V. In this manner, upper spray assembly 142 may be configured for urging or cascading a flow of wash fluid downward over rack assemblies 122, 124, and 126. As further illustrated in FIG. 2, upper rack assembly 126 may further define an integral spray manifold 144, which is generally configured for urging a flow of wash fluid substantially upward along the vertical direction V through upper rack assembly 126.

The various spray assemblies and manifolds described herein may be part of a fluid distribution system or fluid circulation assembly 150 for circulating water and wash fluid in the tub 104. More specifically, fluid circulation assembly 150 includes a pump 152 for circulating water or wash fluid (e.g., detergent, water, or rinse aid) in the tub 104. Pump 152 may be located within sump 138 or within a machinery compartment located below sump 138 of tub 104, as generally recognized in the art. Fluid circulation assembly 150 may include one or more fluid conduits or circulation piping for directing water or wash fluid from pump 152 to the various spray assemblies and manifolds. For example, as illustrated in FIG. 2, a primary supply conduit 154 may extend from pump 152, along rear 112 of tub 104 along the vertical direction V to supply wash fluid throughout wash chamber 106.

As illustrated, primary supply conduit 154 is used to supply wash fluid to one or more spray assemblies (e.g., to mid-level spray arm assembly 140 and upper spray assembly 142). However, it should be appreciated that according to alternative embodiments, any other suitable plumbing configuration may be used to supply wash fluid throughout the various spray manifolds and assemblies described herein. For example, according to another example embodiment, primary supply conduit 154 could be used to provide wash fluid to mid-level spray arm assembly 140 and a dedicated secondary supply conduit (not shown) could be utilized to provide wash fluid to upper spray assembly 142. Other plumbing configurations may be used for providing wash fluid to the various spray devices and manifolds at any location within dishwasher appliance 100.

Each spray arm assembly 134, 140, 142, integral spray manifold 144, or other spray device may include an arrangement of discharge ports or orifices for directing wash fluid received from pump 152 onto dishes or other articles located in wash chamber 106. The arrangement of the discharge ports, also referred to as jets, apertures, or orifices, may provide a rotational force by virtue of wash fluid flowing through the discharge ports. Alternatively, spray arm assemblies 134, 140, 142 may be motor-driven, or may operate using any other suitable drive mechanism. Spray manifolds and assemblies may also be stationary. The resultant movement of the spray arm assemblies 134, 140, 142 and the spray from fixed manifolds provides coverage of dishes and other dishwasher contents with a washing spray. Other configurations of spray assemblies may be used as well. For example, dishwasher 100 may have additional spray assemblies for cleaning silverware, for scouring casserole dishes, for spraying pots and pans, for cleaning bottles, etc. One skilled in the art will appreciate that the embodiments discussed herein are used for the purpose of explanation only and are not limitations of the present subject matter.

In operation, pump 152 draws wash fluid in from sump 138 and pumps it to a diverter assembly 156 (e.g., which may be positioned within sump 138 of dishwasher appliance 100). Diverter assembly 156 may include a diverter disk (not shown) disposed within a diverter chamber 158 for selectively distributing the wash fluid to the spray arm assemblies 134, 140, 142 or other spray manifolds or devices. For example, the diverter disk may have a plurality of apertures that are configured to align with one or more outlet ports (not shown) at the top of diverter chamber 158. In this manner, the diverter disk may be selectively rotated to provide wash fluid to the desired spray device.

According to an example embodiment, diverter assembly 156 is configured for selectively distributing the flow of wash fluid from pump 152 to various fluid supply conduits, only some of which are illustrated in FIG. 2 for clarity. More specifically, diverter assembly 156 may include four outlet ports (not shown) for supplying wash fluid to a first conduit for rotating lower spray arm assembly 134 in the clockwise direction, a second conduit for rotating lower spray arm assembly 134 in the counter-clockwise direction, a third conduit for spraying an auxiliary rack such as the silverware rack, and a fourth conduit for supply mid-level or upper spray assemblies 140, 142 (e.g., such as primary supply conduit 154).

The dishwasher 100 is further equipped with a controller 160 to regulate operation of the dishwasher 100. The controller 160 may include one or more memory devices and one or more microprocessors, such as general or special purpose microprocessors operable to execute programming instructions or micro-control code associated with a cleaning cycle. The memory may represent random access memory such as DRAM, or read only memory such as ROM or FLASH. In one embodiment, the processor executes programming instructions stored in memory. The memory may be a separate component from the processor or may be included onboard within the processor. Alternatively, controller 160 may be constructed without using a microprocessor (e.g., using a combination of discrete analog or digital logic circuitry, such as switches, amplifiers, integrators, comparators, flip-flops, AND gates, and the like) to perform control functionality instead of relying upon software.

The controller 160 may be positioned in a variety of locations throughout dishwasher 100. In the illustrated embodiment, the controller 160 may be located within a control panel area 162 of door 116, as shown in FIGS. 1 and 2. In such an embodiment, input/output ("I/O") signals may be routed between the control system and various operational components of dishwasher 100 along wiring harnesses that may be routed through the bottom of door 116, and/or printed circuit boards (PCB) such as those illustrated in FIG. 4 and FIG. 5. Typically, the controller 160 includes a user interface panel 164 through which a user may select various operational features and modes and monitor progress of the dishwasher 100. In one embodiment, the user interface 164 may represent a general purpose I/O ("GPIO") device or functional block. In certain embodiments, the user interface 164 includes input components 166, such as one or more of a variety of electrical, mechanical or electro-mechanical input devices including rotary dials, push buttons, and touch pads. As shown, one or more user inputs 166 (e.g., buttons) of user interface 164 may be positioned at a top end 216 of door 116 (e.g., on or through a top wall of door 116). The user interface 164 may further include one or more display components 168, such as a digital display device or one or more indicator light assemblies designed to provide operational feedback to a user. The user interface 164 may be in communication with the controller 160 via one or more signal lines or shared communication busses.

It should be appreciated that the invention is not limited to any particular style, model, or configuration of dishwasher 100. Furthermore, it should be appreciated that the invention is not limited to dishwashing appliances in general, but can be extended to any appliance having a printed circuit board providing AC power to a load. Additionally, the example embodiment depicted in FIGS. 1 and 2 is for illustrative purposes only. For example, different locations may be provided for user interface 164, controller 160, and/or any associated PCB, and other differences may be applied while remaining within the scope of the present disclosure.

Figure 3:
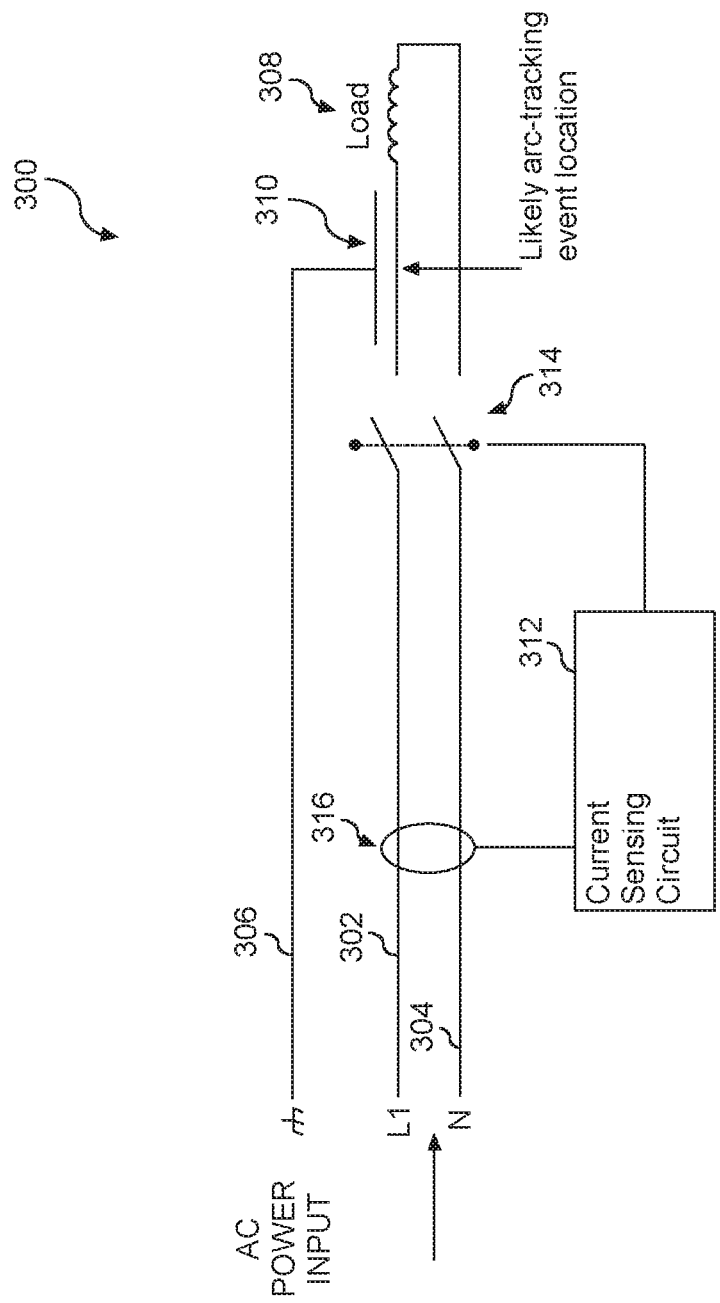
FIG. 3 is a schematic of PCB trace integrity sensing circuitry, according to example embodiments of the present disclosure.

Turning now generally to FIGS. 3 through 6, PCB trace integrity sensing circuitry and PCBs having the same according to example embodiments of the present disclosure are described in detail. FIG. 3 is a schematic of PCB trace integrity sensing circuitry 300, according to example embodiments of the present disclosure.

As illustrated in FIG. 3, the PCB trace integrity sensing circuitry 300 may include a first trace 302, a second trace 304, and a third trace 306. Generally, the first trace 302 is configured to provide AC power to a load 308. Furthermore, the second trace 304 may be configured to provide a return path for the AC power from the load 308. Additionally, the third trace 306 may be configured to provide an alternate return path for the AC power from the load. The alternate return path may include at least one portion 310 of the third trace 306 that is proximate the first trace 302 so as to provide a likely arc-tracking location associated with the load 308. Additionally, the load 308 may be in communication with the controller 160, according to some embodiments.

Generally, the load 308 may include any load associated with an appliance. For example, the load 308 may include a motor, a heater, a spray arm assembly, a pump or pump assembly, or any other suitable load. The load 308 may also include lighting, displays, or other aesthetic loads not directly associated with function of the appliance.

As further illustrated in FIG. 3, the PCB trace integrity sensing circuitry 300 may include current sensing circuitry 312 in operative communication with control relay 314. For example, the current sensing circuitry 312 may be configured to sense leakage current between the first trace 302 and the third trace 306. For example, the current sensing circuitry 312 may be configured to measure or detect a current differential between each leg of the load 308 at sensing location 316. The current sensing circuitry 312 may also be configured to measure or detect current flowing on the third trace 306. In this particular example, the third trace 306 is connected to earth-ground. However, any other alternate return path for the AC power may also be suitable, including a return path to the first trace 302 not directly being sensed by the current sensing circuitry 312.

In general, the current sensing circuitry 312 may be configured to measure current exceeding a first threshold. The first threshold may be chosen as an amount of current that would likely cause arc-tracking, such as between 5 and 50 milliamps. Another threshold may include between about 30 and 50 milliamps. Additionally, other thresholds may also be suitable depending upon a particular form of a PCB and size of a load. Upon sensing the threshold amount of leakage current, the current sensing circuitry 312 and/or the controller 160 may sever the first trace 302 and the second trace 304 via the control relay 314. Alternatively, the current sensing circuitry 312 may also sever lead lines or a wiring harness supplying AC power to the first trace 302 and/or second trace 304, in some embodiments.

Figure 4:
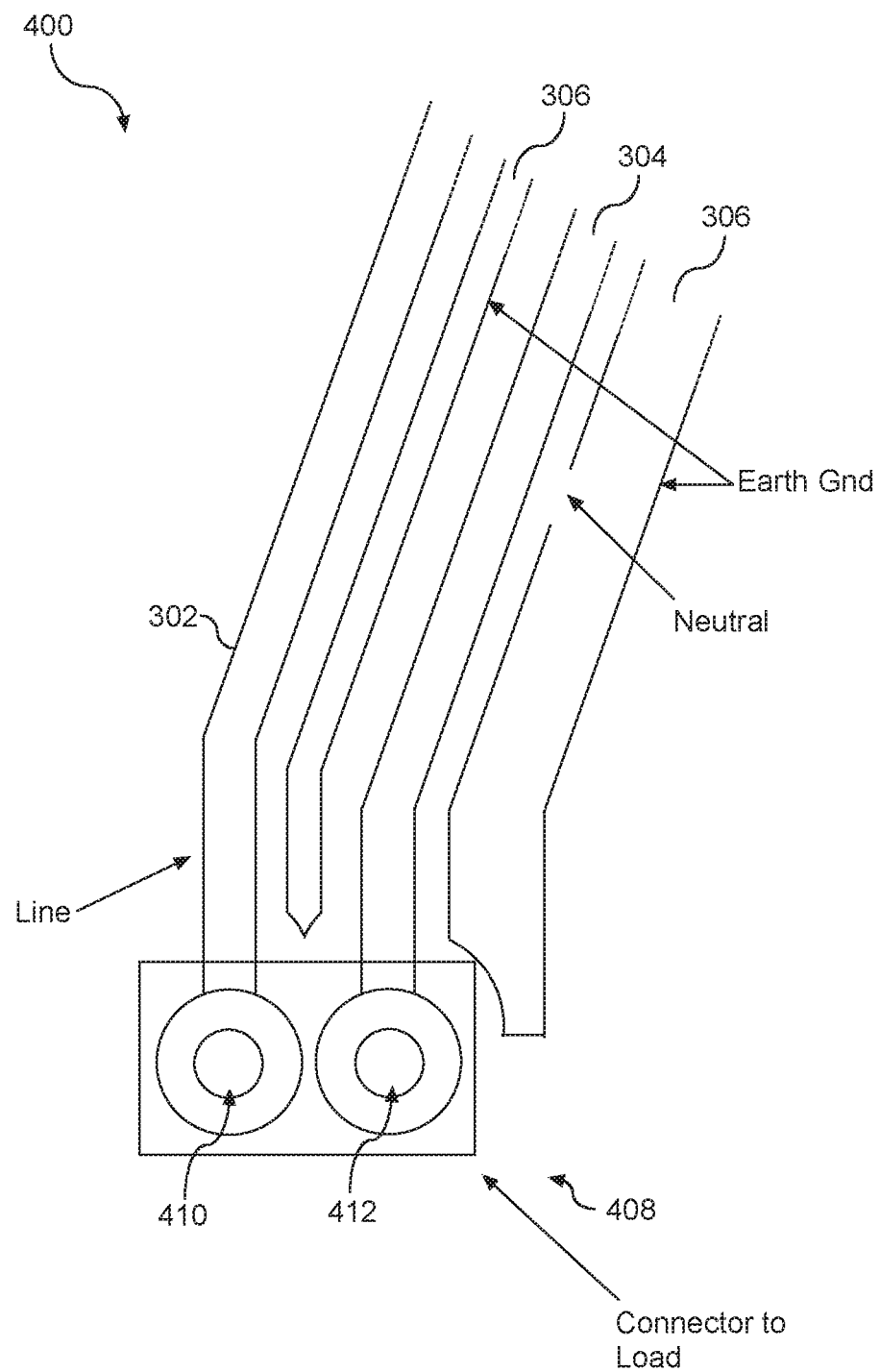
FIG. 4 is a plane view of an example PCB having the PCB trace integrity sensing circuitry of FIG. 3 implemented.
Figure 5:
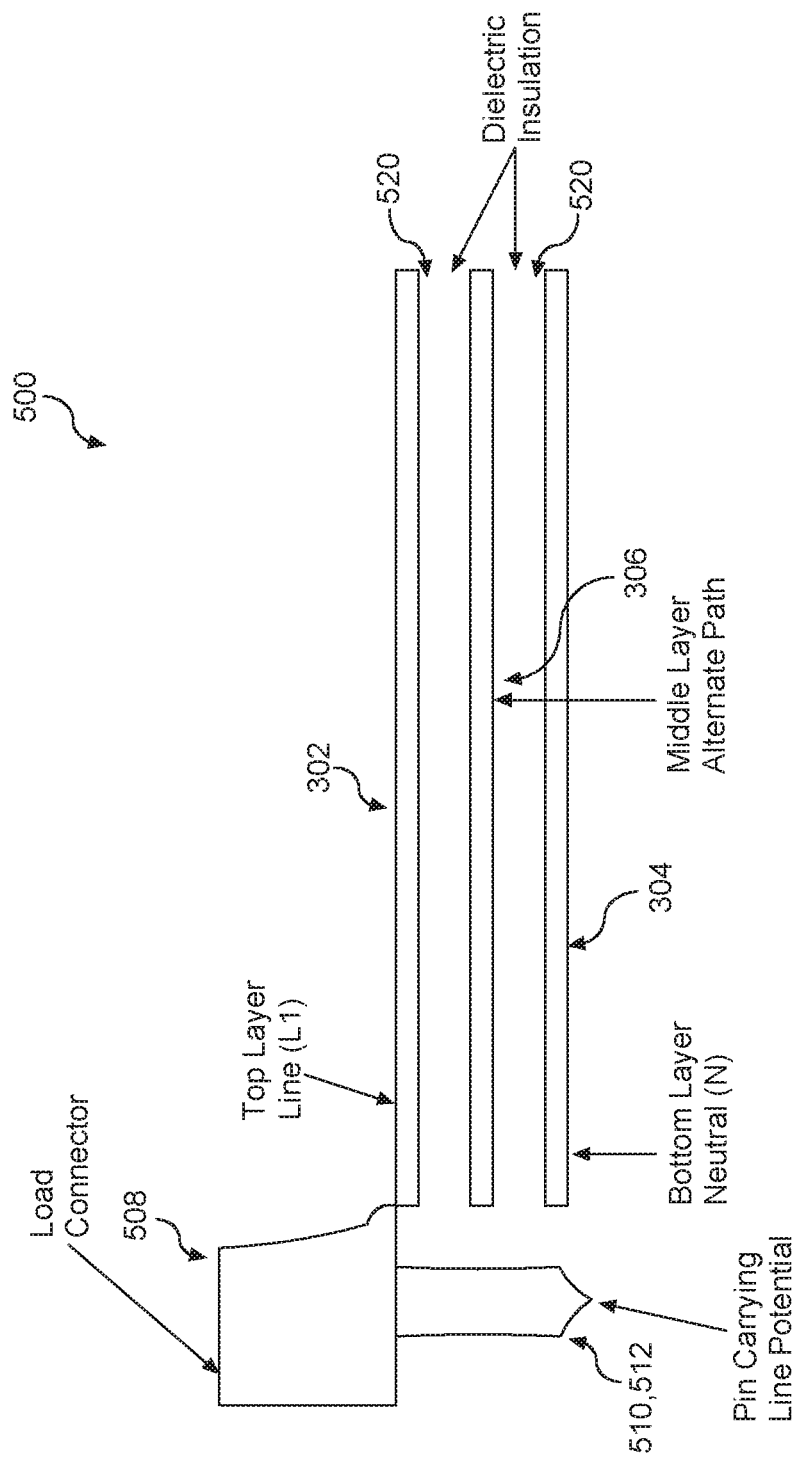
FIG. 5 is a cross-sectional view of an additional example PCB having the PCB trace integrity sensing circuitry of FIG. 3 implemented.

As described above, the current sensing circuitry 312 may be configured to detect leakage current such that prior to arc-tracking occurring at the likely arc-tracking location 310, the first and second traces are severed using the control relay 314. Upon severing the traces or triggering the control relay 314, the appliance may be serviced to replace the PCB thereby avoiding costly repairs to the load 308 or the entire appliance 100. The PCB trace integrity sensing circuitry 300 may be implemented on a PCB in a plurality of manners. Turning now to FIG. 4 and FIG. 5, several example implementations of the PCB trace integrity sensing circuitry 300 are described in detail.

FIG. 4 is a plane view of an example PCB 400 having the PCB trace integrity sensing circuitry 300 implemented. The PCB 400 includes the first trace 302, the second trace 304, and the third trace 306. Additionally, the PCB 400 includes a physical connector 408 configured to receive a complimentary connector for physically connecting the first and second traces to the load 308. The connector 408 can contain two physical pins 410 and 412, or other electrical connection portions, for facilitating connection of the load 308. The two pins 410 and 412 supply power to and from the load. As further shown, the third trace 306 (e.g., earth-ground) is routed in relatively close proximity to the first trace 302 and the second trace 304.

As shown in FIG. 4, the third trace 306 is disposed between the first trace 302 and the second trace 304. In this example, the third trace 306 is disposed within a predetermined distance from the first trace 302 such that the likely arc-tracking location 310 is provided between the first and third traces. In one example, the predetermined distance is generally less than a distance separating the first trace 302 and the second trace 304. According to other examples, the predetermined distance may be chosen based on a sensitivity of the current sensing circuitry 312. Accordingly, the location 310 is promoted between the first and third traces, as opposed to the first and second traces.

In this example, as long as AC power is transferred on the first trace 302 and the second trace 304, there is normal operation with limited possibility of arc-tracking. However, if there is isolation breakdown (i.e., due to arc tracking) near the connector 408 or along the first and second trace, it is likely that leakage current will begin occurring on the third trace 306. Under these circumstances, the current sensing circuitry 312 would function as described with reference to FIG. 3, and sever the first and second traces using the control relay 314.

While described as being arranged between the first and second traces, the third trace 306 may also be sandwiched between layers of the PCB, and therefore between the first and second traces. For example, FIG. 5 illustrates such an alternate configuration of traces. FIG. 5 is a cross-sectional view of an additional example PCB having the PCB trace integrity sensing circuitry of FIG. 3 implemented.

As shown in FIG. 5, a multi-layer PCB 500 can include three conducting layers, 302, 306, and 304 separated by insulation 520. The top and bottom layers are the current carrying traces supplying AC power to the load 308. The middle trace is the alternate path for the current sensing circuitry 312 to detect an arc tracking event. As further shown, a connector 508 having pins 510, 512 arranged somewhat similarly to connector 408 and pins 410, 412 is also provided.

In this example, as long as AC power is transferred on the first trace 302 layer and the second trace 304 layer, there is normal operation with limited possibility of arc-tracking. However, if there is isolation breakdown (i.e., due to arc tracking) near the connector 508 or along the first and second trace, it is likely that leakage current will begin occurring on the third trace 306. Under these circumstances, the current sensing circuitry 312 would function as described with reference to FIG. 3, and sever the first and second traces using the control relay 314.

As described above, PCBs 400 and 500 having the PCB trace integrity sensing circuitry 300 implemented have been provided. The PCBs 400 and 500 may be any PCBs facilitating at least three traces for providing a first return path for AC power and an alternate return path for the AC power from a load. The PCBs may also be altered to include or exclude a solder mask, or further include or exclude a non-conformal coating. The lack of a solder mask or the inclusion of a non-conformal coating may enhance resistance to arc-tracking events and increase longevity of any associated appliance.

Figure 6:
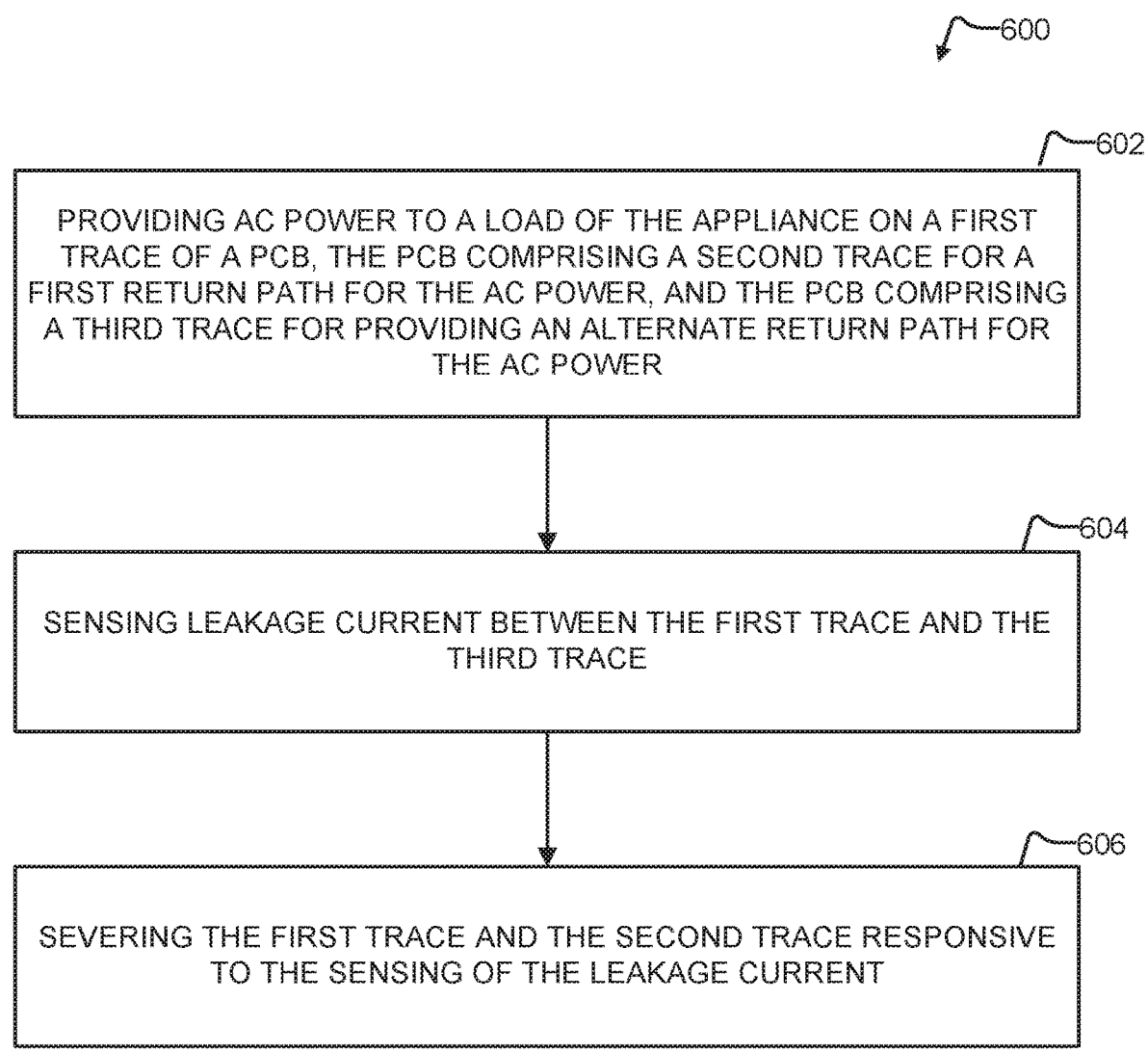
FIG. 6 is a flowchart of a method of sensing PCB trace integrity, according to example embodiments of the present disclosure.

FIG. 6 is a flowchart of a method 600 of sensing PCB trace integrity, according to example embodiments of the present disclosure. The method 600 may include providing AC power to a load 308 of the appliance 100 on a first trace 302 of a PCB, at block 602. The PCB may include a second trace 304 for a first return path for the AC power, and, a third trace 306 for providing an alternate return path for the AC power. The method 600 may also include sensing leakage current between the first trace 302 and the third trace 306, at block 604. The method 600 may also include severing the first trace 302 and the second trace 304 responsive to the sensing of the leakage current, at block 604.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance with automatic sensing of printed circuit board (PCB) trace integrity, the appliance comprising:
    a controller operative to control operation of the appliance;
    a load in operative communication with the controller; and
    a PCB comprising:
        a first trace supplying AC power to the load;
        a second trace supplying a return path for the AC power;
        a third trace supplying an alternate return path for the AC power; and
        current sensing circuitry configured to sense leakage current between the first trace and the third trace, the leakage current being indicative of declining trace integrity of the PCB.

2. The appliance of claim 1, wherein the PCB further comprises a relay configured to sever the first trace and the second trace responsive to the leakage current exceeding a first threshold.

3. The appliance of claim 2, wherein the first threshold is between 5 and 50 milliamps.

4. The appliance of claim 1, wherein the third trace is disposed within a predetermined distance from the first trace.

5. The appliance of claim 4, wherein the predetermined distance is configured based on a sensitivity of the current sensing circuitry.

6. The appliance of claim 1, wherein the third trace is disposed between the first trace and the second trace.

7. The appliance of claim 1, wherein the third trace is sandwiched between the first trace and the second trace.

8. The appliance of claim 1, wherein the third trace is an earth-ground trace.

9. The appliance of claim 1, wherein the PCB further comprises a non-conformal coating.

10. The appliance of claim 1, wherein the PCB lacks a solder mask coating.

11. A method of sensing printed circuit board (PCB) trace integrity in an appliance, the method comprising:
    providing AC power to a load of the appliance on a first trace of a PCB, the PCB comprising a second trace for a first return path for the AC power, and the PCB comprising a third trace for providing an alternate return path for the AC power;

sensing leakage current between the first trace and the third trace; and, severing the first trace and the second trace responsive to the sensing of the leakage current.

12. The method of claim 11, wherein severing the first trace and the second trace is responsive to the leakage current exceeding a first threshold.

13. The method of claim 12, wherein the first threshold is between 5 and 50 milliamps.

14. The method of claim 11, wherein the third trace is disposed within a predetermined distance from the first trace.

15. The method of claim 14, wherein the predetermined distance is configured based on a sensitivity of the sensing leakage current.

16. The method of claim 11, wherein the third trace is disposed between the first trace and the second trace.

17. The method of claim 11, wherein the third trace is sandwiched between the first trace and the second trace.

18. The method of claim 11, wherein the third trace is an earth-ground trace.

19. The method of claim 11, further comprising applying a non-conformal coating to the PCB.

20. The method of claim 11, further comprising removing a solder mask coating from the PCB.

* * * * *